United States Patent [19]

Yamada

[11] 4,176,314
[45] Nov. 27, 1979

[54] DOUBLE INTEGRATION METHOD FOR MEASURING DEVIATION OF STANDARD AND REFERENCE ANALOG QUANTITIES

[75] Inventor: Toyohiko Yamada, Nagoya, Japan

[73] Assignee: Shin-Shirasuna Electric Corp., Aichi, Japan

[21] Appl. No.: 847,235

[22] Filed: Oct. 31, 1977

[30] Foreign Application Priority Data

Nov. 15, 1976 [JP] Japan .................. 51-137008

[51] Int. Cl.$^2$ .................. G01R 17/00; G01R 15/12; G01R 31/02
[52] U.S. Cl. .................. 324/140 D; 324/73 R; 328/147
[58] Field of Search .................. 324/51, 73 R, 73 PC, 324/140 R, 140 D; 328/146-149, 161, 127; 307/355; 364/605, 830

[56] References Cited

U.S. PATENT DOCUMENTS

| | | | |
|---|---|---|---|
| 3,286,175 | 11/1966 | Gerbier et al. | 324/73 R |
| 3,467,865 | 9/1969 | Scott et al. | 324/140 R |
| 3,621,387 | 11/1971 | Smith | 324/73 R |
| 3,657,527 | 4/1972 | Kassabgi et al. | 324/73 PC X |
| 3,716,783 | 2/1973 | Deering | 324/51 X |
| 3,723,867 | 3/1973 | Canarutto | 324/73 PC |
| 3,981,586 | 9/1976 | Scott | 324/140 D X |

Primary Examiner—Gerard R. Strecker
Attorney, Agent, or Firm—Schwartz, Jeffery, Schwaab, Mack, Blumenthal & Koch

[57] ABSTRACT

In a method of measuring electrical analog quantities, a first analog signal representing a first electrical analog quantity which is to be a reference is subtracted from a second analog signal representing a second electrical analog quantity which is to be compared with the first analog quantity, so that a difference signal is produced. Then, the difference signal thus produced is integrated for a predetermined time to obtain a third analog signal. Simultaneously therewith, the first analog signal is also integrated for the predetermined time to obtain a fourth and a fifth analog signal representing the positive and the negative value of the aforementioned integration. And the third analog signal is integrated between it and the fifth or the fourth analog signal in accordance with the positive or the negative sign of the third analog signal to obtain a sixth analog signal. Detection is made of the time from the point whereat the integration for obtaining the sixth analog signal is started till the point whereat the sixth analog signal becomes zero, so that a digital signal is produced. Thereafter, measurement is made of the ratio to the first analog quantity of the difference between the first electrical analog quantity and the second electrical analog quantity in accordance with the digital signal.

1 Claim, 1 Drawing Figure

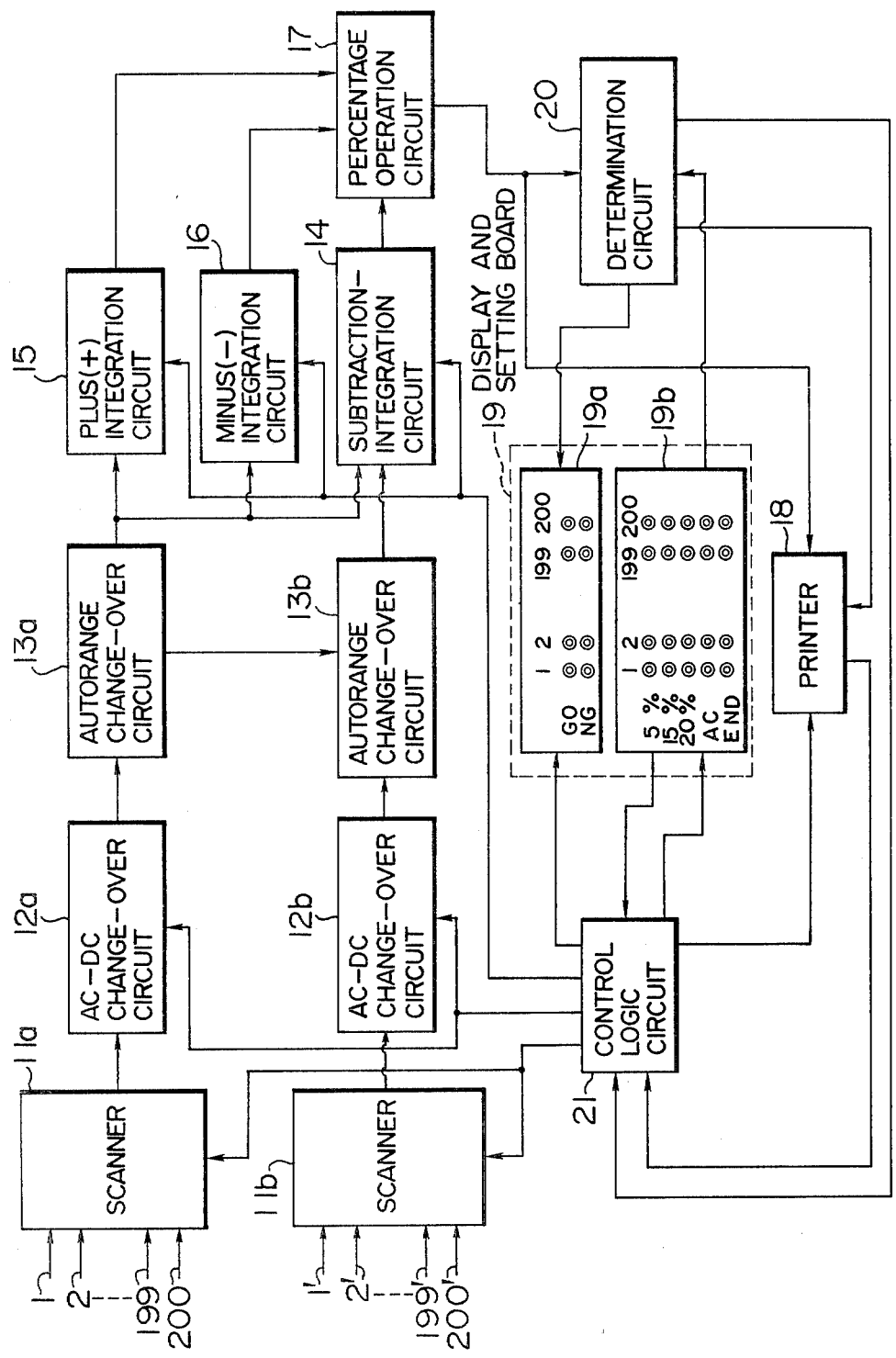

DOUBLE INTEGRATION METHOD FOR MEASURING DEVIATION OF STANDARD AND REFERENCE ANALOG QUANTITIES

This invention relates to a method for measuring electrical analog quantities, and more particularly to a method for digitally measuring the relation of a sample electrical analog quantity to an arbitrarily selected electrical analog quantity.

For example, to examine whether an electric circuit incorporated on a printed substrate has desired characteristics or not, it has heretofore been the common practice to adopt a method which comprises individually measuring the electrical characteristics of such a circuit at various points thereon and comparing the results of the measurements with a reference value to determine the acceptability of the circuit. Such a method, however, has been inefficient and sometimes inaccurate inasmuch as it involves the need for an operator to carry out the individual measurements, and has also suffered from difficulties in the data processing of the measurement results.

The inventor has repeated various considerations and experiments to determine the characteristics of such electric circuits and finally thought out the method of the present invention, which he has ascertained can achieve a sufficiently satisfactory success.

Accordingly, it is an object of the present invention to provide an improved method of measuring electrical analog quantities.

Other objects, features and advantages of the present invention will become apparent from the following description taken in conjunction with the accompanying drawing.

The drawing is a block diagram showing an example of the circuit arrangement capable of carrying out the method of the present invention.

An embodiment of the present invention will hereinafter be described by reference to the accompanying drawing. For convenience, the ensuing description will be made with respect to a case where the present invention is applied for the measurement of electrical characteristics at various points on an electric circuit incorporated on a printed substrate. However, this is only illustrative of the invention and the method of the present invention is not restricted thereto but it will be appreciated by those skilled in the art that the invention is basically directed to the measurement of the relation of a sample electrical analog quantity to a electrical analog quantity which is to be a reference and is applicable to other various usages.

In the drawing, 11a and 11b respectively designate 200-channel scanners having two hundred input terminals 1 to 200 and 1' to 200', respectively. Although not shown, one scanner 11a is associated with a printed plate incorporating thereon an electric circuit which is to be a reference (hereinafter referred to as the standard printed plate), and the other scanner 11b is associated with a printed plate incorporating thereon an electric circuit whose characteristics are to be compared with those of the standard printed plate (hereinafter referred to as the sample printed plate). In this instance, the input terminals of each scanner are connected to the points on the respective printed plates whereat the characteristics are to be measured, and these scanners are designed to scan from the input terminal 1, 1' to the input terminal 200, 200' in synchronism with one another. The standard printed plate and the sample printed plate may be of the same design and the standard printed plate may be one arbitrarily selected as having satisfactory characteristics. On the output side of each scanner 11a, 11b, there may be successively provided a first analog signal representing an electrical analog quantity corresponding to the electrical characteristic of the standard printed plate and a second analog signal representing an electrical analog quantity corresponding to the electrical characteristic of the sample printed plate as the scanning from the input terminal 1, 1' to the input terminal 200, 200' takes place. Thus, the first analog signal from the scanner 11a for the standard printed plate is applied through an AC-DC change-over circuit 12a and an autorange change-over circuit 13a to one input terminal of a subtraction-integration circuit 14, a plus (+) integration circuit 15 and a minus (−) integration circuit 16, and the second analog signal from the scanner 11b for the sample printed plate is applied through an AC-DC change-over circuit 12b and an autorange change-over circuit 13b to the other input terminal of the subtraction-integration circuit 14. Thus, in the subtraction-integration circuit 14, the second analog signal is subtracted from the first analog signal to form a difference signal which is integrated for a predetermined time, whereby a third analog signal is obtained at the output side of the subtraction-integration circuit 14. The first analog signal, as already noted, is also applied both to the plus (+) integration circuit 15 and the minus (−) integration circuit 16, and in these integration circuits, the first analog signal is integrated simultaneously with the integration by the subtraction-integration circuit 14 and for a time corresponding to said time during which the integration by the circuit 14 takes place, whereby a fourth and a fifth analog signal representing the positive and the negative value of a signal obtained by so integrating the first analog signal are obtained at the output sides of the plus (+) integration circuit 15 and the minus (−) integration circuit 16, respectively. Thereafter, the third, fourth and fifth analog sinals respectively available from the subtraction-integration circuit 14, the plus (+) integration circuit 15 and the minus (−) integration circuit 16 are applied to a percentage operation circuit 17. This operation circuit 17 is of the double integration analog-digital type and if the third analog signal from the subtraction-integration circuit 14 is of the positive sign, it integrates the third analog signal between it and the fifth analog signal from the minus (−) integration circuit 16, and if the third analog signal is of the negative sign, it integrates the third analog signal between it and the fourth signal from the plus integration circuit 15, thereby providing a sixth analog signal. In addition, the operation circuit 17 may detect the time from the point whereat the aforementioned integration (double integration) for obtaining the sixth analog signal in the operation circuit 17 is started till the point whereat the sixth analog signal becomes zero, thereby forming a digital signal, and in accordance with such digital signal, the operation circuit may provide a signal representing the ratio of the difference between the electrical characteristic at a certain point on the standard printed plate represented by the first analog signal (hereinafter referred to as the first electrical analog quantity) and the electrical characteristic at a certain point on the sample printed plate represented by the second analog signal and corresponding to said certain point on the standard printed plate (hereinafter referred to as the second electrical analog quantity), to the first electrical analog quantity. Such a signal from the operation circuit 17 is applied to a printer 18. Designated by 19 is a display and setting board comprising a display portion 19a and a setting portion 19b. The display portion may display whether or not the output from the operation circuit 17 represents an acceptable measurement result, by means of a pair of light emitting elements which may emit different color lights, for example, green and red. The setting portion 19b may set an accetable range, say, 5%, 10% or 20%, for each channel, as by inserting a pin therein. Designated by 20 is a determination circuit to which the operation circuit 17 and the setting portion 19b are connected in the manner as shown. The determination circuit may determine whether or not the output from the operation circuit 17 is within the range set by the setting portion 19b, and in accordance with the result of the determination, may turn on a corresponding light emitting element of the display portion. The determination circuit 20 is also connected to the printer 18 to cause the latter to print in black or red in accordance with whether the output from the operation circuit 17 is within the aforementioned acceptable range. Designated by 21 is a control logic circuit.

According to the present invention, as will be appreciated, electrical analog quantities such as electrical characteristics at various points on an electric circuit incorporated on a printed plate, for example, may be efficiently and reliably measured under the contrast with an electrical analog quantity of the same kind which is an arbitrarily selected reference. Also, the results of the measurements may be printed directly by a printer and this is very convenient for data processing.

While this invention has been described with respect to one specific embodiment thereof, it should be understood that the invention is not restricted thereto but various modifications and changes may be made therein without departing from the spirit and scope of the invention as defined in the appended claims.

What is claimed is:

1. A method of measuring electrical analog quantities comprising subtracting a first analog signal representing a first electrical analog quantity which is to be a reference from a second analog signal representing a second electrical analog quantity which is to be compared with said first analog quantity, to thereby obtain a difference signal, integrating said difference signal for a pre-determined time to thereby obtain a third analog signal and simultaneously therewith integrating said first analog signal for said pre-determined time to obtain a fourth and a fifth analog signal representing the positive and the negative value of said integration, obtaining the sum of the integral of said third analog signal and said fifth or said fourth analog signal in accordance with the positive or the negative sign of said third analog signal to thereby obtain a sixth analog signal, detecting the time from the point whereat said integration for obtaining said sixth analog signal is started till the point whereat said sixth analog signal becomes zero to thereby obtain a digital signal, and measuring the ratio of the difference between said first electrical analog quantity and said second electrical analog quantity to said first electrical analog quantity in accordance with said digital signal.

* * * * *